United States Patent [19]

You

[11] Patent Number: 5,420,812
[45] Date of Patent: May 30, 1995

[54] BIDIRECTIONAL TYPE CCD

[75] Inventor: Young J. You, Seoul, Rep. of Korea

[73] Assignee: Goldstar Electron Co., Ltd., Rep. of Korea

[21] Appl. No.: 255,268

[22] Filed: Jun. 7, 1994

[30] Foreign Application Priority Data

Nov. 5, 1993 [KR] Rep. of Korea ............... 23416/1993

[51] Int. Cl.⁶ ..................... G11C 11/42; G11C 13/04
[52] U.S. Cl. ..................................... 365/183; 365/63
[58] Field of Search ............... 365/183, 189.01, 230.01, 365/51, 63

[56] References Cited

U.S. PATENT DOCUMENTS 5,289,408 2/1994 Mimura et al. ..................... 365/183

Primary Examiner—Terrell W. Fears
Attorney, Agent, or Firm—Poms, Smith, Lande & Rose

[57] ABSTRACT

A bidirectional-type charge coupled device in which the directions of the signal flow can be changed by an external controlling signal.

1 Claim, 13 Drawing Sheets

BIDIRECTIONAL TYPE CCD

FIELD OF THE INVENTION

The present invention relates to a bidirectional type Charge Coupled Device (CCD), more particularly, to the bidirectional type CCD which enables to covert directionality of the signal flow into the forward or backward direction according to an external controlling signal.

BACKGROUND OF THE INVENTION

A CCD for transferring the charges in one direction under pulsed gate is widely used in various memory devices, logic circuits and signal processing, and the image pickup device.

The CCD stores the charges in the potential well created in the bulk of a semiconductor substrate and transports the stored charges in one direction according to the clock pulse applied to a gate.

FIG. 1 shows a sectional view of a conventional charge coupled device.

Referring to FIG. 1, a p type semiconductor substrate 11 is provided with an n type impurity area 12 including a multiplicity of lightly-doped n- type barrier areas 13 separated from each other by a constant distance.

A gate oxidation layer 14 is formed over the semiconductor substrate 11, and a plurality of first and second gate electrodes 15 and 16 are formed on each portion of the gate oxidation layer which corresponds to the -type impurity area 12 and the lightly-doped n- type barrier areas 13, respectively.

A plurality of lightly-doped n- type barrier areas 13 are formed in the n type impurity area 12 separated from each other by a constant distance, so that a consecutive H-L (High-Low) junction is made between a multiplicity of lightly-doped n-type barrier areas 13 and the n type impurity area 12.

The impurity concentration difference between n type impurity area 12 and n- type barrier area 13 makes it be formed a potential well as shown in FIG. 1B, even under the conditions that no voltage is applied to the first and second gates 15 and 16.

A plurality of first and second gate electrodes 25 and 26 each having a constant width are sequentially arrayed in the alternate form over the semiconductor substrate 21 and receive the clock pulses $\phi 11$, $\phi 12$. A plurality of first and second gate electrodes 15, 16 are generally made of such as polysilicon material. The first clock signal $\phi 11$ is applied to the adjacent odd second gate electrodes and even first gate electrodes 16-1 and 15-2, 16-3 and 15-4, . . . , 16-n−1 and 15-n through a signal line L11 connecting said gate electrodes together, and the second clock signal $\phi 12$ is applied to the adjacent even second gate electrodes and odd first gate electrodes 16-2 and 15-3, 16-4 and 15-5, . . . , 16-n and 15-n+1 through a signal line L12 connecting said gate electrodes together.

When the clock pulses $\phi 11$, $\phi 12$ of two-phase, which is shown in FIG. 3, are applied to a plurality of first and second gate electrodes 15, 16 of such a conventional CCD, the first clock signal $\phi 11$ is applied to the adjacent odd second gate electrodes and even first gate electrodes 16-1 and 15-2, 16-3 and 15-4, . . . , 16-n−1 and 15-n among a plurality of first and second gate electrodes 15, 16 through a signal line L11, and the second clock signal $\phi 12$ is applied to the adjacent even second gate electrodes and odd first gate electrodes 16-2 and 15-3, 16-4 and 15-5, . . . , 16-n and 15-n+1 through a signal line L12 among a plurality of first and second gate electrodes 15, 16. That is, in the case that the clock pulses $\phi 11$, $\phi 12$ of two-phase are applied as shown in FIG. 2, a signal of low level is provided through the first signal line L11 which is substantially $\phi 11$ clock signal line and a signal of high level provided through the second signal line L12 which is substantially $\phi 12$ clock signal line.

Accordingly, the low signal is applied to the adjacent odd second gate electrodes and even first gate electrodes 16-1 and 15-2, 16-3 and 15-4, . . . , 16-n−1 and 15-n among a plurality of first and second gate electrodes 15, 16, and the signal of high level is applied to the adjacent even second gate electrodes and odd first gate electrodes 16-2 and 15-3, 16-4 and 15-5, . . . , 16-n and 15-n+1, thereby it is obtained the potential distribution in the stepped form as shown in FIG. 3B.

Therefore a deep potential well in which the charges are stored appears in n-type impurity area 12 beneath odd first gate electrodes 15-1, 15-3, . . . , 15-n+1 according to said clock pulses $\phi 11$, $\phi 12$.

If, at a time point t=1, the clock pulses $\phi 11$, $\phi 12$ of two-phase are applied after a lapse of a time interval, the first and second clock signals as high and low level, in contradiction to the situation at a time point t=0 of FIG. 4A, are input into the first and second clock signal line L11 and L12, respectively.

Accordingly, the signal of high level is applied to the adjacent odd second gate electrodes and even first gate electrodes 16-1 and 15-2, 16-3 and 15-4, . . . , 16-n−1 and 15-n among a plurality of first and second gate electrodes 15, 16, and the signal of low level is applied to the adjacent even second gate electrodes and odd first gate electrodes 16-2 and 15-3, 16-4 and 15-5, . . . , 16-n and 15-n−1, thereby it is obtained a potential distribution in the stepped form as shown in FIG. 4B.

Therefore, the deep potential well appears in n type impurity area 12.

Thus, the stored charges in n type impurity area 12 beneath odd first gate electrodes 15-1,15-3, . . . , 15-n+1 at a time t=0 can be transferred and then stored in n type impurity area 12 beneath next even first gate electrodes 15-1,15-3, . . . , 15-n at a time t=1.

When the consecutive two-phase clock pulses $\phi 11$, $\phi 12$ are provided with the first and second gate electrodes 15,16, the charges are transferred from the left to the right, which the transferred signal is sensed by means of a sensing amplifier (not shown) and then is detected as the electrical signals of time-series.

It is necessary to convert directionality of the signal flow into the other direction so as to obtain a mirror image, but to accomplish that object, the conventional CCD requires additional shift register or memory means by which the data are written in FIFO (First-In Last Out) manner and then read-out, thereby the charge transfer flow being converted into the opposite direction.

SUMMARY OF THE INVENTION

The object of this invention is to provide a bidirectional type Charge Coupled Device (CCD) which enables to covert directionality of the signal flow into the forward or backward direction according to an external controlling signal.

A bidirectional type CCD of this invention comprises a first type conductive semiconductor substrate; a second type conductive impurity area in the substrate; a plurality of lightly-doped second type conductive barrier areas formed in the impurity area which are separated from each other by a constant distance, a gate oxidation layer formed over the substrate; a plurality of first gate electrodes formed on the gate oxidation layer corresponding to the impurity area existing between the , adjacent barrier areas; a plurality of second gate electrodes which are formed on the gate oxidation layer corresponding to the barrier areas and alternately arrayed with a plurality of first gate electrodes; a plurality of first MOS transistors for switching a charge transfer to forward direction which are provided between the adjacent first and second gate electrodes among a plurality of first and second gate electrodes; a plurality of second MOS transistors for switching a charge transfer to backward direction which are provided between the adjacent first and second gate electrodes among a plurality of first and second gate electrodes and between the adjacent first gate electrodes among a plurality of first gate electrodes; a first charge transfer direction controlling signal line for applying an external charge transfer direction control signal to a plurality of first MOS transistors; an inverter for inverting the external charge transfer direction control signal; a second charge transfer direction controlling signal line for applying an inverted charge transfer direction control signal through said inverter to a plurality of first MOS transistors; a first clock signal line through which a second clock signal is applied and which is connected between the adjacent even second MOS transistors and odd first MOS transistors among a plurality of first and second MOS transistors; and a second clock signal line through which a second clock signal is applied and which is connected between the adjacent odd second MOS transistors and even first MOS transistors among a plurality of first and second MOS transistors.

BRIEF DESCRIPTION OF THE DRAWINGS

FIGS. 6A and 6B through FIGS. 9A and 9B are a sectional view of the CCD and a potential distribution diagram of that CCD explaining the operation of the CCD according to the invention.

DETAILED DESCRIPTION OF THE INVENTION

Figure 5:
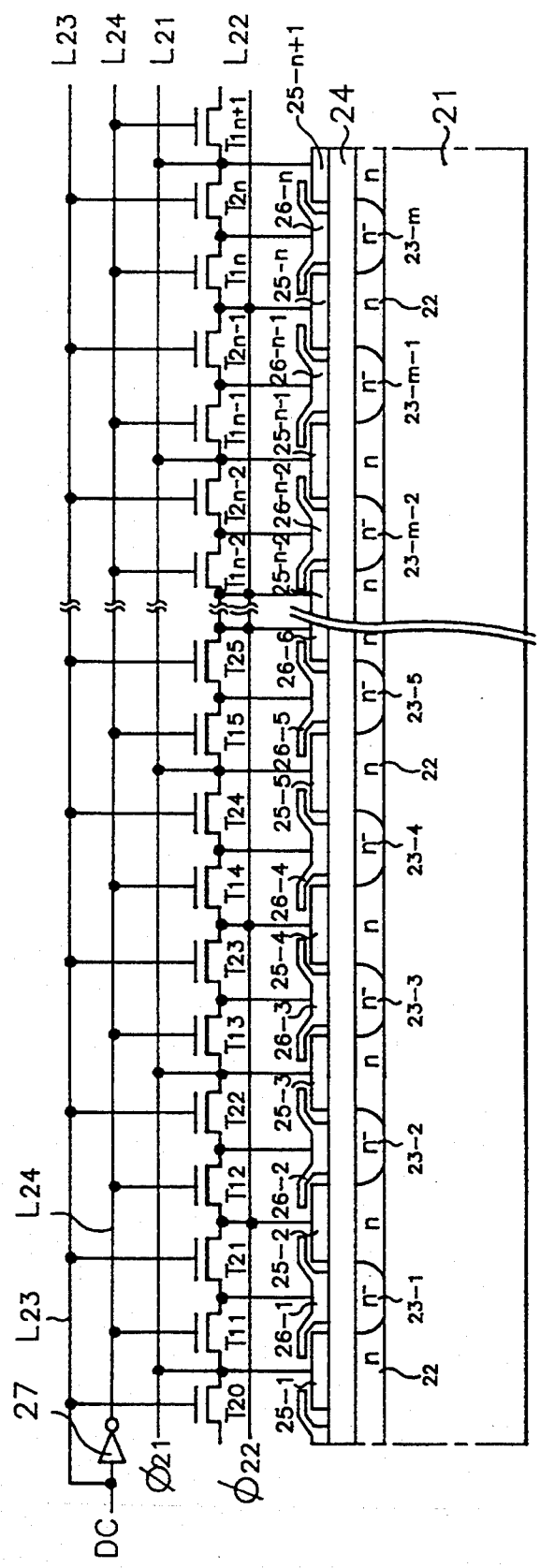
FIG. 5 is a sectional view of a bidirectional type CCD of the invention.

FIG. 5 is a sectional view of a bidirectional type CCD of the invention.

Referring to FIG. 5, a p type semiconductor substrate 21 is provided with an n type impurity area 22 including a multiplicity of lightly-doped n- type barrier areas 23 separated from each other by a constant distance.

Since a plurality of lightly-doped n- type barrier areas 23 are formed in the n type impurity area 22 separated from each other by a constant distance, a consecutive H-L junction is made between a multiplicity of lightly-doped n- type barrier areas 23 and the n type impurity area 22.

A gate oxidation layer 24 is formed over the semiconductor substrate 21, and a plurality of first and second gate electrodes 25 and 26 are formed on each portion of the gate oxidation layer which corresponds to the n type impurity area 22 and the lightly-doped n- type barrier areas 23, respectively.

A plurality of first and second gate electrodes 25 and 26 are sequentially arrayed in the alternate form over the semiconductor substrate 21.

A plurality of first switching MOS transistor T11 to T1n are provided between the adjacent first and second gate electrodes 25-1 and 26-1, 25-2 and 26-2, . . . , 25-n and 26-n among a plurality of first and second gate electrodes 25 and 26, and a plurality of second switching MOS transistor T21 to T2n are provided between the adjacent first and second gate electrodes 26-1 and 25-2, 26-2 and 25-3, . . . , 26-n−1 and 25-n among a plurality of first and second gate electrodes 25 and 26.

So as to apply an external charge transfer direction controlling signal DC, a first control signal line L23 is connected to a plurality of second switching MOS transistor T21 to T2n, and through a second control signal line L24 a plurality of first switching MOS transistor T11 to T1n receive an inverted charge transfer direction controlling signal DC by an inverter 27.

A first clock signal line L21 through which a first clock signal is applied is connected between the adjacent odd second switching MOS transistors and even first switching MOS transistors T22 and T13, T24 and T15, . . . ,T2n−2 and T1n−1, T2n and T1n+1 among a plurality of first and second MOS transistors T11 to T1n and T21 to T2n, And a second clock signal line L22 through which a second clock signal is applied is connected between the adjacent odd second switching MOS transistors and even first switching MOS transistors T21 and T12, T23 and T14, . . . ,T2n−1 and T1n among a plurality of first and second MOS transistors T11 to T1n and T21 to T2n.

Therefore the first clock signal φ21 through the first clock signal line L21 is applied to the adjacent even second switching MOS transistors and odd first switching MOS transistors T20 and T11, T22 and T13, T24 and T15, . . . ,T2n−2 and T1n−1, T2n and T1n+1, in which the first clock signal φ21 is applied to the adjacent even second gate electrodes and odd first gate electrodes 26-2 and 25-3, 26-4 and 25-5, 26-n and 25-n+1 in the case that even second switching MOS transistors T22, T24,T2n−2,T2n are turned on according to the applied charge transfer direction controlling signal DC, the first clock signal φ21 is applied to the adjacent odd first gate electrodes and odd second gate electrodes 25-1 and 26-1, 25-3 and 26-3, 25-n−1 and 26-n−1 in the case that odd second switching MOS transistors T11, T13, T15, T1n−1 are turned on according to the applied charge transfer direction controlling signal DC. Meanwhile, the second clock signal φ22 through the second clock signal line L22 is applied to the adjacent odd second switching MOS transistors and even first switching MOS transistors T21 and T12, T23 and T14, . . . ,T2n−1 and T1n, in which the second clock signal φ22 is applied to the adjacent odd second gate electrodes and even first gate electrodes 26-1 and 25-2, 26-3 and 25-4, 26-n−1 and 25-n in the case that odd second switching MOS transistors T21,T23, . . . ,T2n−1 are turned on according to the applied charge transfer direction controlling signal DC, the second clock signal $\phi 22$ is applied to the adjacent even first gate electrodes and even second gate electrodes 25-2 and 26-.2, 25-4 and 26-4, 25-n and 26-n in the case that even second switching MOS transistors T12, T14, . . . ,T1n are turned on according to the applied charge transfer direction controlling signal DC.

It will be explained in detail a method of forming a lightly-doped impurity area 23 and n type impurity area 22 over p type semiconductor substrate 21.

An n type impurity area 22 in a p type semiconductor substrate 21 is formed implanting n type impurity ion into the substrate 21.

After forming n type impurity area 22, a gate oxidation layer 24 is formed, and over the substrate 21 a polysilicon layer is deposited and then patterned to a plurality of first gate electrodes of which each having a predetermined width.

Using a plurality of first gate electrodes as a mask, p type impurity ion is implanted into n type impurity area 22 to form a plurality of lightly-doped impurity area 23.

Figure 1A:
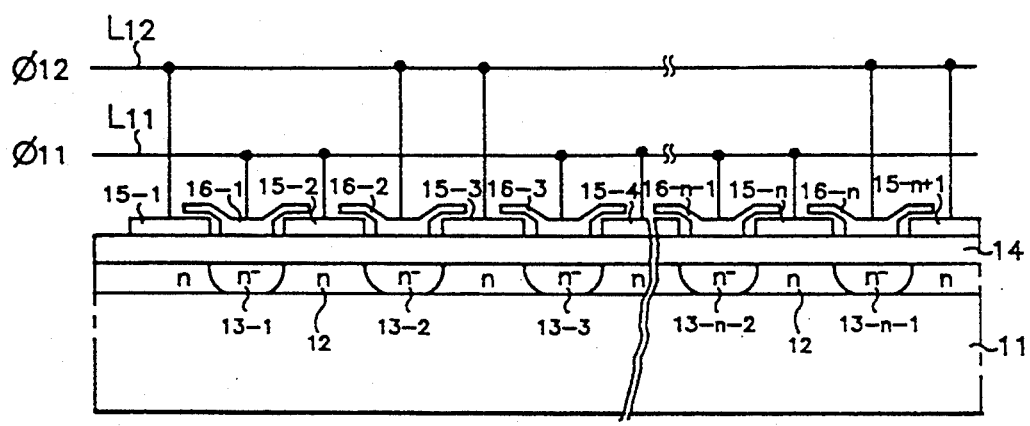
FIGS. 1A and 1B are a sectional view of the conventional CCD and a potential distribution diagram of that CCD, respectively.
Figure 1B:
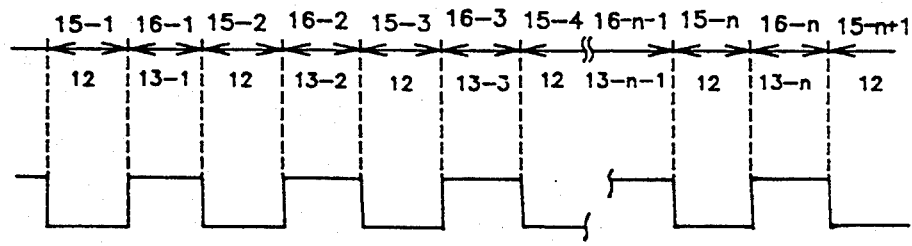
Figure 2:
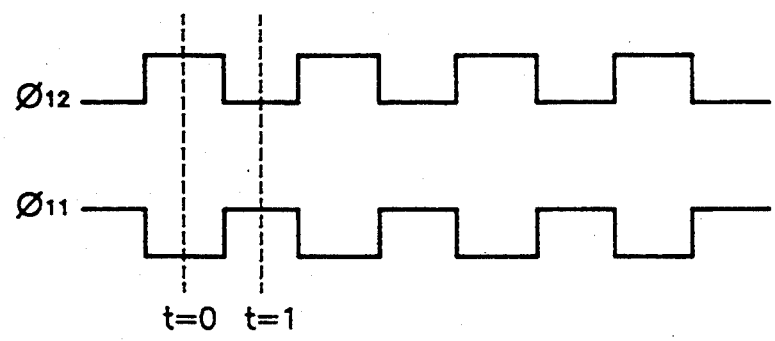
FIG. 2 is timing diagram of two-phase clock pulses applied to the CCD of FIG. 1.
Figure 3A:
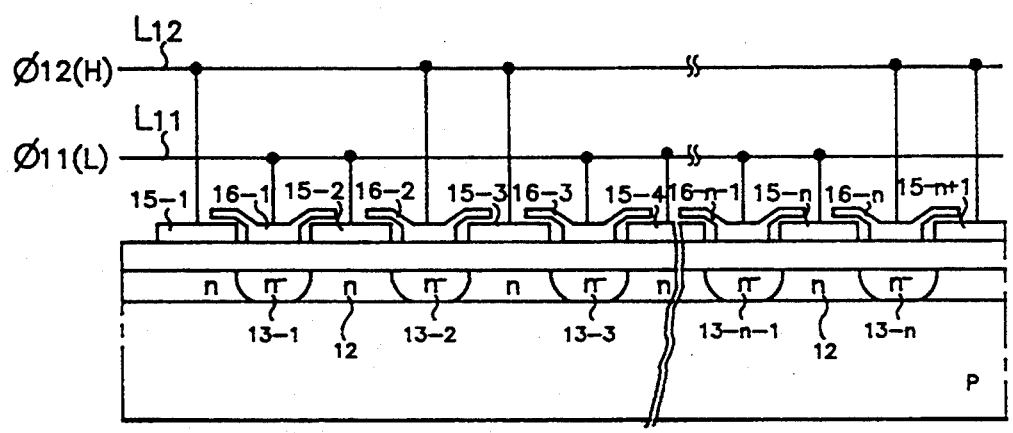
FIGS. 3A and 3B, FIGS. 4A and 4B are a sectional view of the CCD and a potential distribution diagram of that CCD explaining the operation of the conventional CCD of FIG. 1.
Figure 3B:
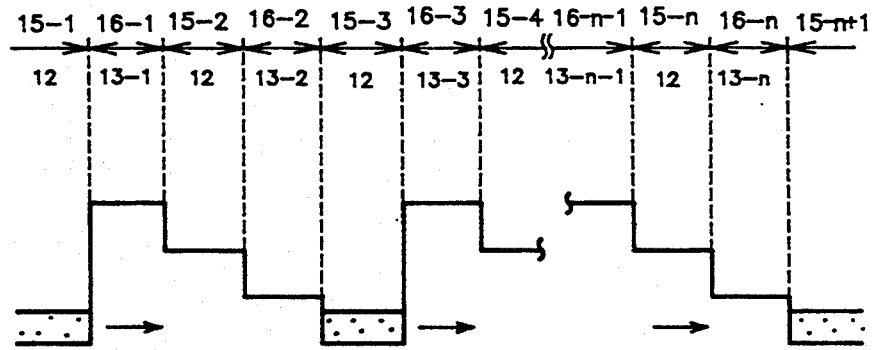
Figure 4A:
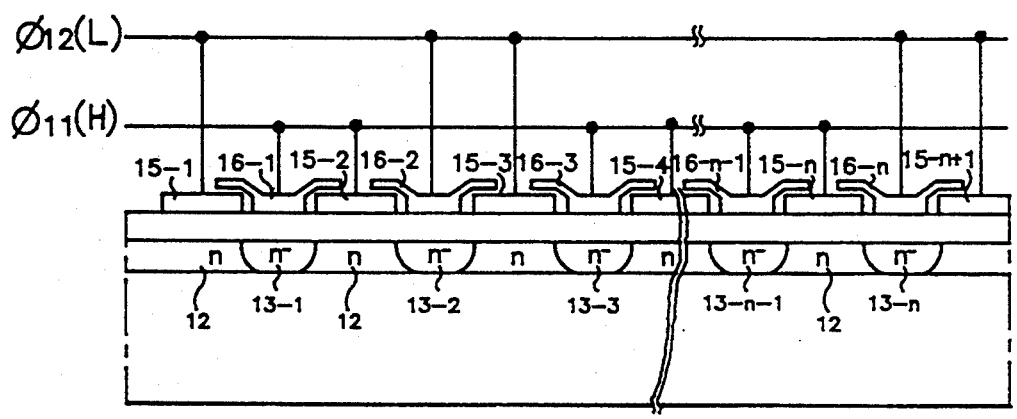
Figure 4B:
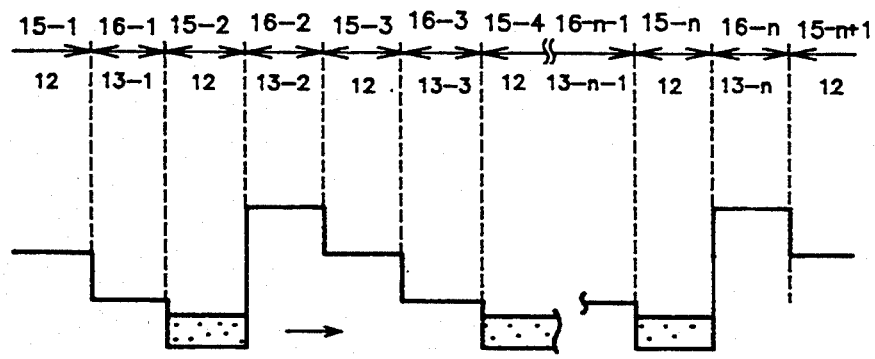

A plurality of lightly-doped n- type areas 23 are formed in the n-type impurity area 22 separated from each other by a constant distance, so that the impurity concentration difference between n type impurity area 22 and n- type barrier area 23 makes it be formed a potential well associated with the CCD of FIG. 5, which is the same as shown in FIG. 1B.

The operation of the CCD as shown in FIG. 5 is explained with reference to FIG. 6 to FIG. 9.

Figure 6A:
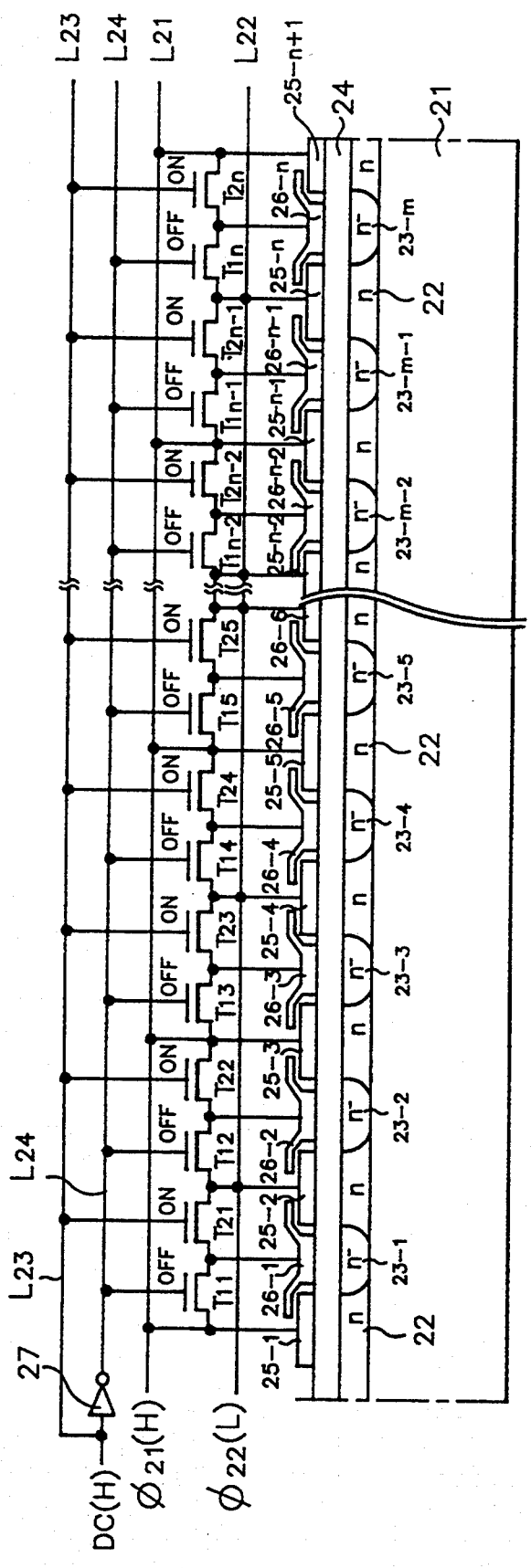
Figure 6B:
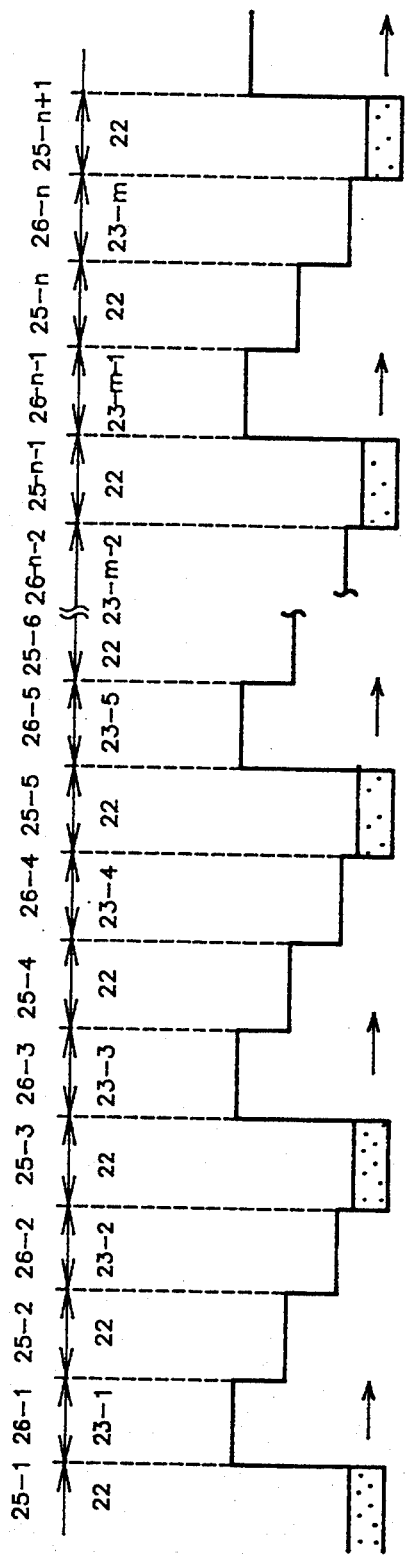
Figure 7A:
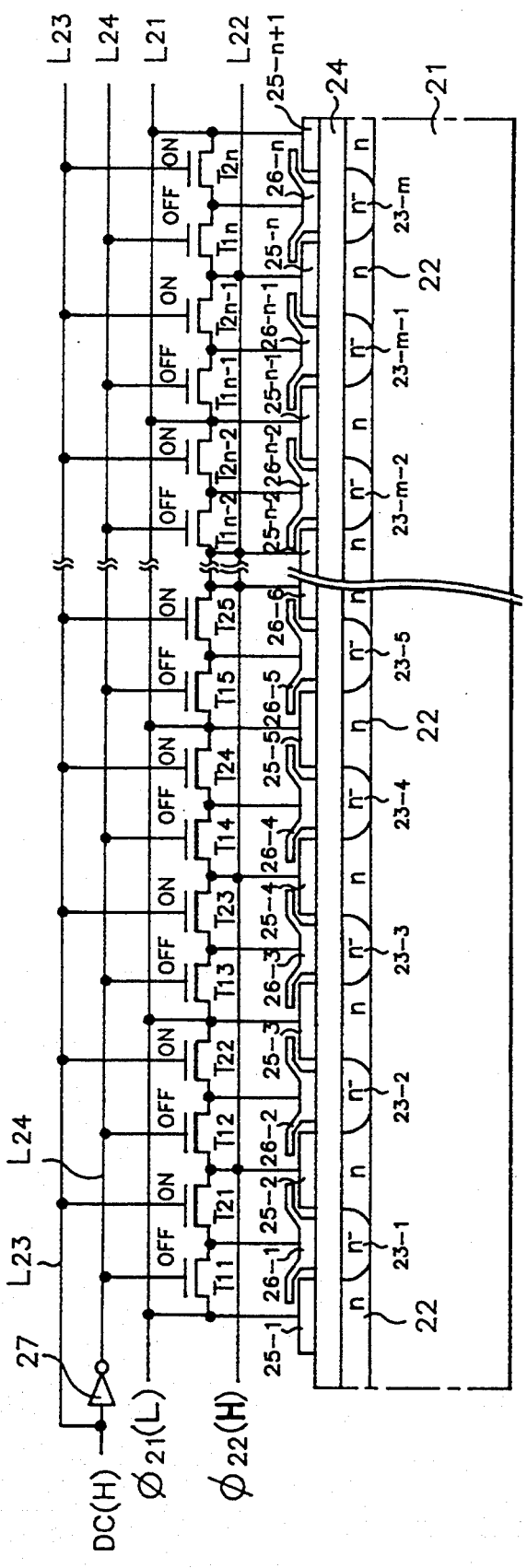
Figure 7B:
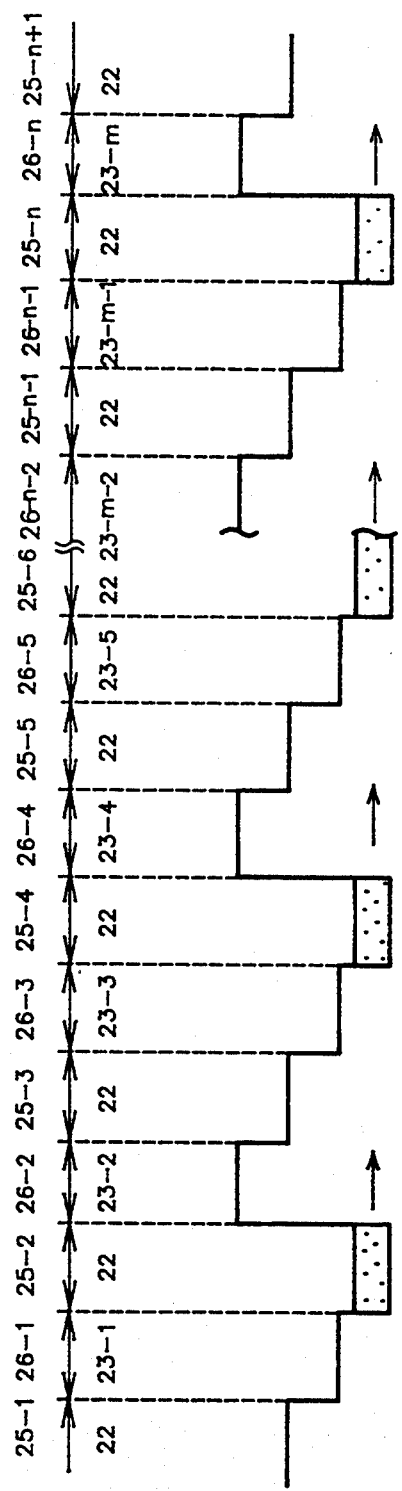
Figure 8A:
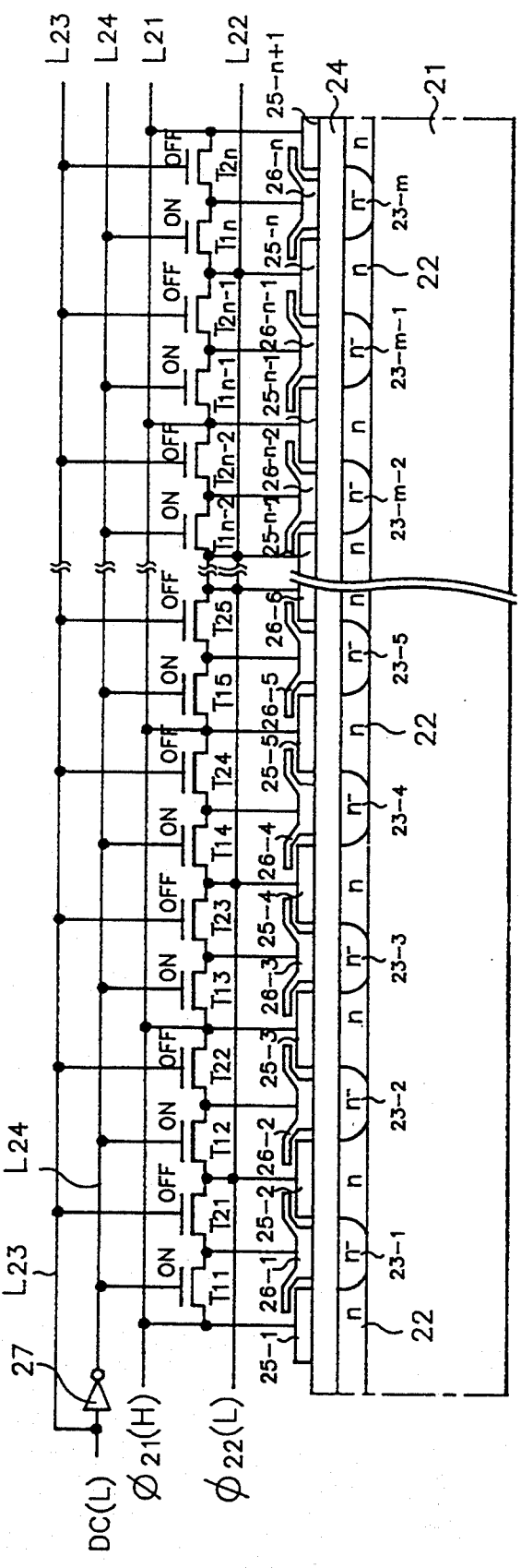
Figure 8B:
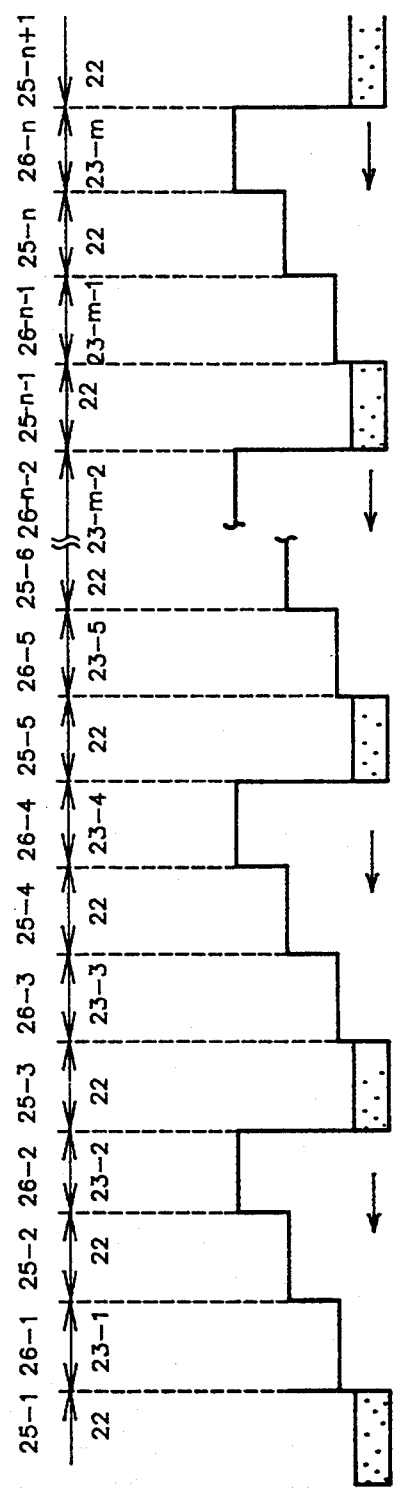
Figure 9A:
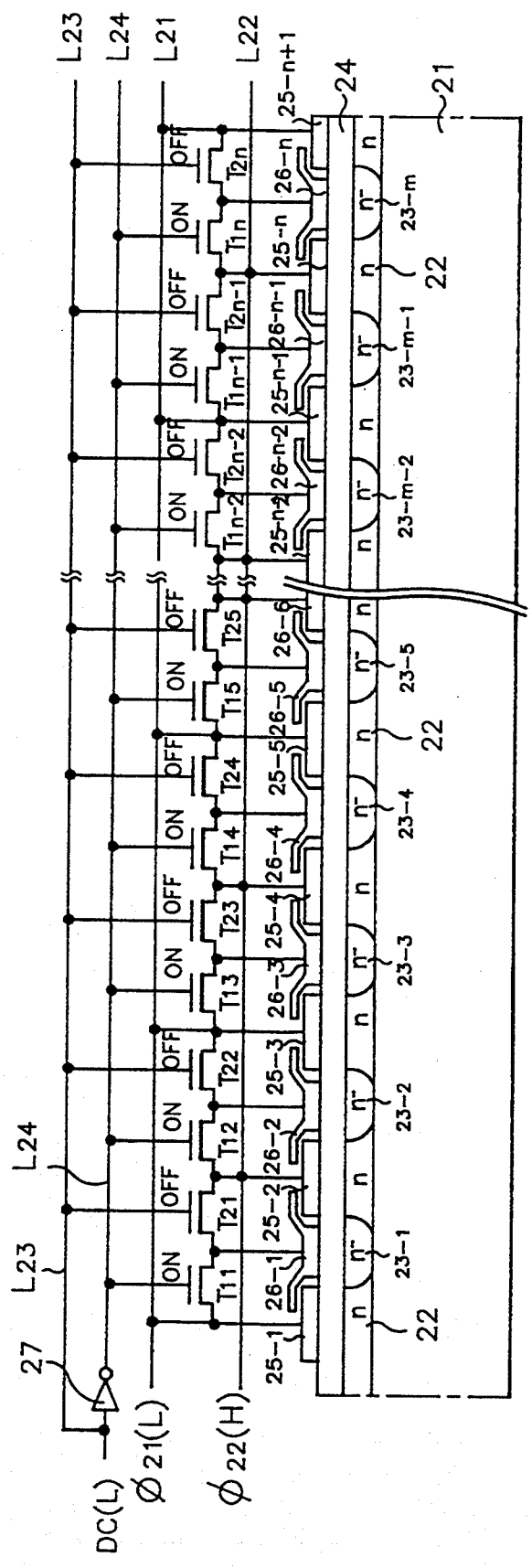

With reference to FIG. 6 and FIG. 7, it is explained the charge transfer procedures according to the applied clock signals $\phi 21$, $\phi 22$ under high level of the charge transfer direction controlling signal DC, and FIG. 8 and FIG. 9 explains the charge transfer procedures according to the applied clock signals $\phi 21$, $\phi 22$ when the charge transfer direction controlling signal DC is low level.

Referring to FIG. 6 and FIG. 7, the charge transfer procedures from the left to the right is explained as follows.

In FIG. 6, as at a time point t=0, the charge transfer direction controlling signal DC of the high level and the clock pulses $\phi 21$, $\phi 22$ of high and low are applied, the charge transfer direction controlling signal DC of the high level is applied through the first control signal line L23 to the gate of a plurality of second switching MOS transistors T21,T22, . . . ,T2n which are thus turned on, and said signal DC of high level is inverted by the inverter 27 and then the signal DC of low level is applied through the second control signal line L24 to the gate of a plurality of first switching MOS transistors T11,T12, . . . ,T1n which are thus turned off.

Accordingly, among a plurality of second switching MOS transistors T21, T22, . . . ,T2n even transistors T22,T24, . . . ,T2n are short, and the first clock pulse $\phi 21$ of high level is applied to the adjacent even second gate electrodes and odd first gate electrodes 26-2 and 25-3, 26-4 and 25-5, . . . ,26-n and 25-n+1 through the first clock signal line L21.

Also, among a plurality of second switching MOS transistors T21, T22, . . . ,T2n odd transistors T21,T23, . . . ,T2n−1 are short, and the second clock pulse $\phi 22$ of low level is applied to the adjacent odd second gate electrodes and even first gate electrodes 26-1 and 25-2, 26-3 and 25-4, . . . ,26-n−1 and 25-n through the second clock signal line L22.

The potential distribution of the CCD is thus obtained as shown in FIG. 6B, from which is seen that a deep potential well is formed in n type impurity area 22 corresponding to odd first gate electrodes 25-1, 25-3, . . . ,25-n−1 and in there the charges are stored thereby.

In FIG. 7, at a time point t=1 after the lapse of the predetermined time, a plurality of second switching MOS transistors T21,T22, . . . ,T2n are turned on by the applied charge transfer direction controlling signal DC of the high level into gates of said MOS transistors through the first control signal line L23, though the clock pulses $\phi 21$, $\phi 22$ of high and low are applied.

Among a plurality of second switching MOS transistors T21, T22, . . . ,T2n even transistors T22,T24, . . . ,T2n are short, and the first clock pulse $\phi 21$ of low level is applied to the adjacent even second gate electrodes and odd first gate electrodes 26-2 and 25-3, 26-4 and 25-5, . . . ,26-n and 25-n+1 through the first clock signal line L21.

And, among a plurality of second switching MOS transistors T21, T22, . . . ,T2n odd transistors T21,T23, . . . ,T2n−1 are short, and the second clock pulse $\phi 22$ of high level is applied to the adjacent odd second gate electrodes and even first gate electrodes 26-1 and 25-2, 26-3 and 25-4, . . . ,26-n−1 and 25-n through the second clock signal line L22.

The potential distribution of the CCD is thus obtained as shown in FIG. 7B and a deep potential well is formed in n type impurity area 22 corresponding to even first gate electrodes 25-2, 25-4, . . . , 25-n.

At a time point t=0, the stored charges in the area 22 under odd first gate electrodes 25-1, 25-3, . . . ,25-n−1 are transferred to the n type impurity area 22 corresponding to next even first gate electrodes 25-2, 25-4, . . . ,25-n and then stored in there.

In the case that two-phase clock pulse of the opposite phases from each other is sequentially provided with a constant interval, the charges as described above are transferred from the left to the right, which the signal is sensed by means of a sense amplifier and then electrically output.

Next, with reference to FIG. 8 and FIG. 9, the charge transfer procedures from the right to the left will be explained.

In FIG. 8, as at a time point t=0, the charge transfer direction controlling signal DC of the low level and the clock pulses $\phi 21$, $\phi 22$ of high and low are applied, the charge transfer direction controlling signal DC of the low level is applied through the first control signal line L23 to the gate of a plurality of second switching MOS transistors T21,T22, . . . ,T2n which are thus turned off, and said signal DC of low level is inverted by the inverter 27 and then the signal DC of low level is applied through the second control signal line L24 to the gate of a plurality of first switching MOS transistors T11,T12, . . . ,T1n which are thus turned on.

Accordingly, among a plurality of first switching MOS transistors T11, T12, . . . ,T1n odd transistors T11,T13, . . . ,T1n−1 are short, and the first clock pulse $\phi 21$ of high level is applied to the adjacent odd first gate electrodes and second gate electrodes 25-1 and 26-1, 25-3 and 26-3, . . . ,25-n−1 and 26-n−1 through the first clock signal line L21.

Also, among a plurality of first switching MOS transistors T11, T13, . . . ,T1n even transistors T12,T14, . . . ,T1n are short, and the second clock pulse $\phi 22$ of low level is applied to the adjacent even first gate electrodes and second gate electrodes 25-2 and 26-2, 25-4 and 26-4, . . . ,25-n and 26-n through the second clock signal line L22.

The potential distribution of the CCD is thus obtained as shown in FIG. 8B, from which is seen that a deep potential well is formed in n-type impurity area 22 corresponding to odd first gate electrodes 25-1, 25-3, . . . ,25-n−1 and in there the charges are stored thereby.

In FIG. 9, at a time point t=1 after the lapse of the predetermined time, a plurality of first switching MOS transistors T11,T12, . . . ,T1n are turned on by the charge transfer direction controlling signal DC inverted to the high level into gates of said MOS transistors through the second control signal line L24, though the clock pulses $\phi 21$, $\phi 22$ of high and low are applied.

Among a plurality of first switching MOS transistors T11, T12, . . . ,T1n even transistors T11,T13, . . . ,T1n−1 are short, and the first clock pulse $\phi 21$ of low level is applied to the adjacent odd second gate electrodes and second gate electrodes 25-1 and 26-1, 25-3 and 26-3, . . . ,25-n−1 and 26-n−1 through the first clock signal line L21.

And, odd transistors T12,T14, . . . ,T1n are short, and the second clock pulse $\phi 22$ of high level is applied to the adjacent even first gate electrodes and second gate electrodes 25-2 and 26-2, 25-3 and 26-4, . . . ,25-n and 26-n through the second clock signal line L22.

Figure 9B:
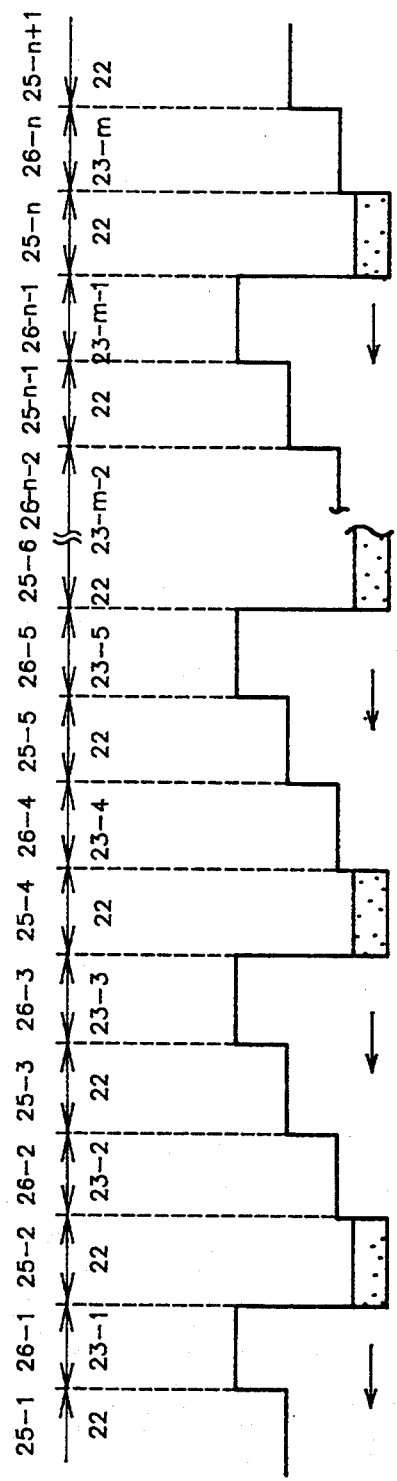

The potential distribution of the CCD is thus obtained as shown in FIG. 9B and a deep potential well is formed in n type impurity area 22 corresponding to even first gate electrodes 25-2, 25-4, . . . ,25-n.

At a time point t=0, the stored charges in the area 22 under odd first gate electrodes 25-1, 25-3, . . . ,25-n are transferred to the n type impurity area 22 corresponding to even first gate electrodes 25-0, 25-2,25-4, . . . ,25-n before now, at a time t=1 after the lapse of a predetermined time interval.

In the case that two-phase clock pulse of the opposite phases from each other is sequentially provided with a constant interval, the charges as described above can be transferred from the left to the right, which the signal is sensed by means of a sense amplifier and then electrically output.

As described above, it is possible to covert directionality of the signal flow into the forward or backward direction according to this invention.

When the bidirectional type CCD is adopted as an image sensor, it facilitates to directly obtain a mirror image only by the change of the direction of the charge transfer, without the separate circuits such as memory or shift resister required to construct the image sensor.

In the delay line, the invention exhibits the advantage of the greatly reduced number of gate electrodes which is required to constitute the delay line such as the charge signal flow is converted to and from for delay and then extract the final output.

Also, in the signal processing fields, the time and space, to and from transfer of the charges can afford to implement the signal processing system with simplicity in construction and endows that system with the versatile functioning.

What is claimed is:

1. A bidirectional type CCD comprising:
    a first type conductive semiconductor substrate;
    a second type conductive impurity area in the substrate;
    a plurality of lightly-doped second type conductive barrier areas formed in the impurity area which are separated from each other by a constant distance,
    a gate oxidation layer formed over the substrate;
    a plurality of first gate electrodes formed on the gate oxidation layer corresponding to the impurity area existing between the adjacent barrier areas;
    a plurality of second gate electrodes which are formed on the gate oxidation layer corresponding to the barrier areas and alternately arrayed with a plurality of first gate electrodes;
    a plurality of first MOS transistors for switching a charge transfer to forward direction which are provided between the adjacent first and second gate electrodes among a plurality of first and second gate electrodes;
    a plurality of second MOS transistors for switching a charge transfer to backward direction which are provided between the adjacent first and second gate electrodes among a plurality of first and second gate electrodes and between the adjacent first gate electrodes among a plurality of first gate electrodes;
    a first charge transfer direction controlling signal line for applying an external charge transfer direction control signal to a plurality of first MOS transistors;
    an inverter for inverting the external charge transfer direction control signal;
    a second charge transfer direction controlling signal line for applying an inverted charge transfer direction control signal through said inverter to a plurality of first MOS transistors;
    a first clock signal line through which a second clock signal is applied and which is connected between the adjacent even second MOS transistors and odd first MOS transistors among a plurality of first and second MOS transistors; and
    a second clock signal line through which a second clock signal is applied and which is connected between the adjacent odd second MOS transistors and even first MOS transistors among a plurality of first and second MOS transistors.

* * * * *